(12) United States Patent
Patterson et al.

(10) Patent No.: US 7,830,288 B2
(45) Date of Patent: Nov. 9, 2010

(54) FAST, EFFICIENT REFERENCE NETWORKS FOR PROVIDING LOW-IMPEDANCE REFERENCE SIGNALS TO SIGNAL PROCESSING SYSTEMS

(75) Inventors: Gregory W. Patterson, High Point, NC (US); Ahmed Mohamed Abdelatty Ali, Oak Ridge, NC (US)

(73) Assignee: Analog Devices, Inc., Norwood, MA (US)

( * ) Notice: Subject to any disclaimer, the term of this patent is extended or adjusted under 35 U.S.C. 154(b) by 0 days.

(21) Appl. No.: 12/692,967

(22) Filed: Jan. 25, 2010

(65) Prior Publication Data

US 2010/0149015 A1 Jun. 17, 2010

Related U.S. Application Data

(63) Continuation-in-part of application No. 12/151,110, filed on May 2, 2008, now Pat. No. 7,652,601.

(51) Int. Cl.
*H03M 1/00* (2006.01)
(52) U.S. Cl. ...................... 341/136; 327/108
(58) Field of Classification Search ............ 341/136; 307/270, 451, 453, 263; 324/173, 16; 327/48; 323/313
See application file for complete search history.

(56) References Cited

U.S. PATENT DOCUMENTS

| | | | |
|---|---|---|---|
| 5,023,472 A | 6/1991 | Hashimoto et al. ........ 307/270 |
| 5,539,308 A | 7/1996 | Teramae et al. ............ 324/173 |
| 5,646,515 A | 7/1997 | Mayes ........................ 323/313 |
| 6,118,266 A | 9/2000 | Manohar et al. ............ 323/316 |
| 6,249,240 B1 | 6/2001 | Bellaouar .................... 341/172 |
| 6,313,692 B1 | 11/2001 | Pease ........................... 327/538 |
| 6,417,725 B1 | 7/2002 | Aram et al. ................. 327/541 |
| 6,486,820 B1 | 11/2002 | Allworth et al. ........... 341/161 |
| 6,788,586 B2 * | 9/2004 | Confalonieri et al. .. 365/189.05 |
| 6,909,391 B2 | 6/2005 | Rossi .......................... 341/161 |
| 7,023,181 B2 | 4/2006 | Nakata ......................... 322/28 |
| 7,026,824 B2 | 4/2006 | Chen .......................... 324/541 |
| 7,098,735 B2 | 8/2006 | Ranganathan ............... 330/252 |
| 7,215,182 B2 | 5/2007 | Ali .............................. 327/538 |
| 2006/0125460 A1 | 6/2006 | Mheen et al. |

OTHER PUBLICATIONS

King, Craig. "Differential ADC Biasing Techniques", Microchip Technology, Application Note AN842, Jun. 2002, pp. 1-4.

(Continued)

*Primary Examiner*—Rexford N Barnie
*Assistant Examiner*—Joseph Lauture
(74) *Attorney, Agent, or Firm*—Koppel, Patrick, Heybl & Dawson

(57) ABSTRACT

Reference network embodiments are provided for use in pipelined signal converter systems. The network embodiments are fast and power efficient and they generate low-impedance reference signals through the use of at least one output transistor, a diode-coupled transistor coupled to the output transistor, and a controller. The controller is configured to provide a backgate voltage to the diode-coupled transistor to thereby establish a substantially-constant output current. The controller is further configured to provide a gate voltage to the output transistor to establish a reference voltage.

13 Claims, 6 Drawing Sheets

OTHER PUBLICATIONS

Miller, Perry et al., "Precision Voltage References", Analog Applications Journal, Nov. 1999, pp. 1-4.

Maximum Application Note 994, "Reference Voltage for Multiple ADCs", Maxim Integrated Products, Sunnyvale, California. Mar. 6, 2002, 4 pages.

Office Action From Related U.S. Appl. No. 12/151,110, mailed: Sep. 18, 2009, References Cited Above.

Reply to Office Action From Related U.S. Appl. No. 12/151,110, Dated: Sep. 24, 2009.

Notice of Allowance From Related U.S. Appl. No. 12/151,110, Mailed: Dec. 2, 2009.

* cited by examiner

FAST, EFFICIENT REFERENCE NETWORKS FOR PROVIDING LOW-IMPEDANCE REFERENCE SIGNALS TO SIGNAL PROCESSING SYSTEMS

RELATED APPLICATIONS

This application is a Continuation-in-part of U.S. application Ser. No. 12/151,110 filed on May 2, 2008 now U.S. Pat. No. 7,652,601, and claims priority of that application as to all matter disclosed therein.

BACKGROUND OF THE INVENTION

1. Field of the Invention

The present invention relates generally to signal converters.

2. Description of the Related Art

Pipelined analog-to-digital converter systems are capable of achieving impressive resolution and signal-to-noise performance at extremely high sample rates (e.g., 150 megasamples per second). Accordingly, they are useful in a wide range of demanding converter applications (e.g., charge-coupled device imaging, ultrasonic medical imaging, base station processing, digital receivers, digital video, cable modems, digital subscriber line systems, and Ethernet systems).

The speed of a pipelined system is realized by processing an analog input signal through a series of converter stages. Each stage provides a respective digital code and, except for the last stage, each also forms an analog residue signal which is passed to a succeeding stage for further conversion. The respective digital code is typically used to apply a selected one of a set of reference signals to switched-capacitor circuits to thereby generate the residue signal. Because the accuracy of the residue signal is directly related to parameters (e.g., speed, accuracy and impedance) of the reference signals, the generation of these signals is critical to the performance of the converter system.

BRIEF SUMMARY OF THE INVENTION

The present disclosure is generally directed to differential and single-ended embodiments of fast, efficient structures and methods for generation of low-impedance reference signals which may be effectively used in analog-to-digital converter systems. The drawings and the following description provide an enabling disclosure and the appended claims particularly point out and distinctly claim disclosed subject matter and equivalents thereof.

DETAILED DESCRIPTION OF THE INVENTION

FIGS. 1-5 are directed to reference network embodiments for providing differential reference signals to systems such as signal processing systems. FIGS. 6A-7B are directed to reference network embodiments for providing single-ended reference signals. The network embodiments are fast and power efficient and they generate low-impedance reference signals through the use of an output diode-coupled transistor that receives a backgate voltage $V_{bg}$ from an appropriate controller. Because diode-coupled transistors exhibit a low impedance, they can complement the low impedance of a complimentary common-drain output stage to thereby form a fast reference source.

Network embodiments preferably include controllers which are configured to control the gates of the complimentary common-drain output stage to thereby selectively set an output reference voltage $V_{ref}$ about the diode-coupled transistor. The controllers are further configured to control the backgate of the diode-coupled transistor to thereby maintain a substantially-constant output reference current $I_{ref}$ that is substantially independent of the output reference voltage $V_{ref}$. For even greater response speed, other network embodiments are formed by replacing the diode-coupled transistor with a bipolar junction transistor.

Figure 1:
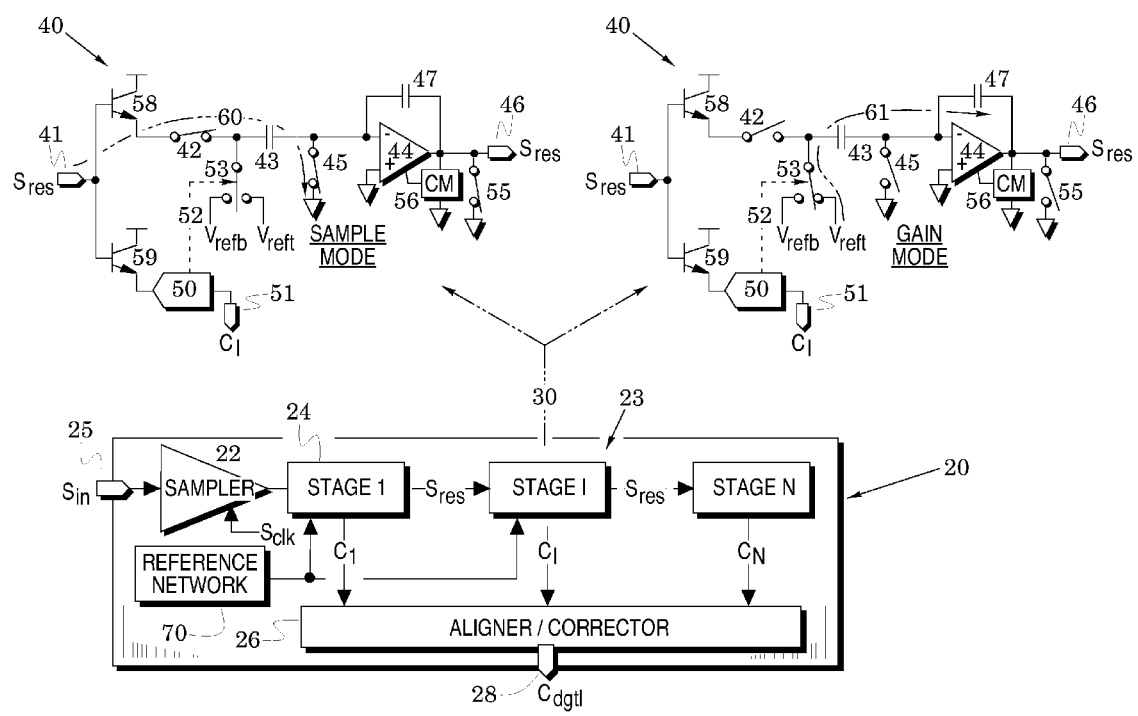
FIG. 1 includes a block diagram of a converter system embodiment and schematics that illustrate operational modes in an exemplary converter stage of the system.

Before investigating various network embodiments, attention is initially directed to the exemplary pipelined signal converter system in FIG. 1 whose performance can be significantly enhanced by incorporation of a reference network. In particular, FIG. 1 illustrates an analog-to-digital converter system 20 that includes a sampler 22 which precedes a string 23 of N pipelined converter stages 24. In response to clock signals $S_{clk}$, the sampler provides, to the string 23, successive samples of an analog input signal $S_{in}$ that is received at a system input port 25.

In response to each of the samples, the first of the converter stages provides a respective digital code $C_1$ and also generates a residue signal $S_{res}$ which is passed to the succeeding converter stage. Except for the Nth converter state, each succeeding converter stage processes a residue signal from the preceding converter stage into a respective digital code and a respective residue signal which is again passed to a succeeding converter stage. The last of the converter stages 24 processes a residue signal from the preceding converter stage into a respective digital code $C_N$.

Because the stages' digital codes that correspond to each sample are generated on successive clock signals, they must be temporally aligned in an aligner/corrector 26 which is also generally configured to use redundancy in the digital codes of the converter stages to correct conversion errors. From the temporally-aligned and corrected codes, the aligner/corrector 26 provides digital codes $C_{dgtl}$ at a system output port 28 that each corresponds to a respective one of the samples from the sampler 22. Before examining an exemplary stage embodiment, it is noted that, in other system embodiments, the sampler 22 may be removed with its sampling function realized within the initial converter stage.

Example arrow 30 directs attention to a switched-capacitor embodiment 40 of an $I_{th}$ one of the converter stages. For exemplary purposes, the embodiment 40 is shown as a 1.5 bit converter stage. In this 1.5 bit embodiment, a first sample switch 42 and a sample capacitor 43 are serially arranged between a converter input port 41 and the input of an amplifier 44. A second sample switch 45 is coupled to the input of the amplifier and the amplifier's output feeds a converter residue port 46 wherein a second capacitor 47 is coupled about the amplifier.

The input port 41 is also coupled to an ADC 50 which feeds a converter code port 51 and also provides a control signal 52 to control a reference switch 53 that couples to a junction between the first sample switch 42 and the sample capacitor 43. In response to the control signal 52, the reference switch 53 selects one of top and bottom reference voltages $V_{reft}$ and $V_{refb}$. Finally, an output switch 55 is coupled to the output of the amplifier 44 and a common-mode (CM) controller 56 provides common-mode control signals to the amplifier in response to the amplifier's output signals.

In other stage embodiments, the first sample switch 42 and the ADC 50 may be preceded by the isolation of buffer transistors 58 and 59. As shown in the converter system 20, the reference signals are provided to all but the last of the stages 24 by a reference network 70. It is noted that the portion of the converter stage embodiment 40 that generates the residue signal $S_{res}$ is often referred to as a multiplying digital-to-analog converter (MDAC).

During each system clock cycle, the switched-capacitor converter stage 40 operates in two successive operational modes to process a residue signal at the input port 41 that lies somewhere in an input window $V_{ref}$. Accordingly, FIG. 1 shows the stage in an initial sample mode and also in a succeeding gain mode. In the sample mode, the second sample switch 45 and the output switch 55 short the input and output of the amplifier 44. In addition, the first and second sample switches 42 and 45 are closed so that the residue signal $S_{res}$ at the input port 41 injects electrical charges along a charge path 60 into the sample capacitor 43. In response to the residue signal at the input port 41, the ADC 50 determines the proper $I_{th}$ digital code $C_I$ to be provided at the converter code port 51.

Based upon its decision of the proper digital code $C_I$, the ADC 44 sets the control signal 52 to select a reference signal in the gain operational mode. Thus a selected one of top and bottom reference voltages $V_{reft}$ and $V_{refb}$ is applied to the sample capacitor 45 to thereby transfer electrical charges along a transfer path 61 from the sample capacitor 43 into the output capacitor 47. This charge transfer generates the residue signal $S_{res}$ at the output port 46 for subsequent processing by the succeeding one of the converter stages 24.

The selection of the proper reference voltage is based on the digital code decision of the ADC 50 in the sample mode and is made so that the selected reference voltage directs the conversion of succeeding converter stages to the portion of the system's transfer function that is occupied by the analog input signal $S_{in}$. In addition to directing succeeding conversion to a proper portion of the system's transfer function, the selected reference signal also causes the output residue signal to be "gained up" so that the full selection window $V_{ref}$ is again presented for processing by the succeeding converter stage.

In an important observation, it is noted that any error in the value of the reference signals $V_{reft}$ and $V_{refb}$ will induce a corresponding error in the residue signal $S_{res}$ that is presented for further processing by succeeding converter stages and this error thus directly corrupts the final digital code $C_{dgtl}$ presented at the system output port 28. In addition, it is noted that the transfer of electrical charges along the transfer path 61 occurs at the system's sample rate.

Accordingly, an improved reference network must have the speed (i.e., bandwidth) sufficient to accurately maintain the reference voltages while providing source and sink currents to multiple converter stages at the system sample rate. To facilitate these high-rate currents, an improved reference system should present these reference voltages with a low output impedance that can accurately drive charges along the transfer path 61.

To further enhance the accuracy of converter systems, the reference voltages should be substantially independent of temperature, process and supply variations. Because a substantial number of converter systems feature selective variation of the span $V_{ref}$ between the reference voltages $V_{reft}$ and $V_{refb}$, an improved reference network should also facilitate this selection. Finally, an improved reference network should be energy efficient in order to enhance the overall efficiency of converter systems.

Figure 2B:
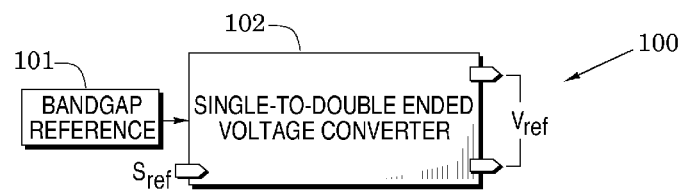
FIG. 2B illustrates a structure for reducing temperature, process and supply variations in the network of FIG. 2A.
Figure 2A:
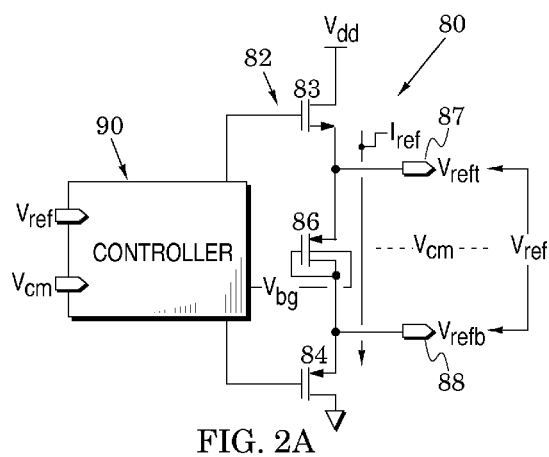
FIG. 2A illustrates a differential reference network embodiment usable, for example, in the system of FIG. 1.

These varied features are provided by the reference network embodiment 80 of FIG. 2A which includes a complimentary common-drain output stage 82 and an output diode-coupled transistor 86 that has an output backgate. The output stage 82 is formed with top and bottom output transistors 83 and 84 and the output diode-coupled transistor 86 is inserted between the top and bottom output transistors.

A controller 90 is configured to provide gate voltages to the top and bottom output transistors to thereby establish top and bottom reference voltages $V_{reft}$ and $V_{refb}$ at top and bottom output ports 87 and 88 that are coupled about the output diode-coupled transistor 86. The top and bottom reference voltages differ by an output voltage $V_{ref}$ that is preferably spaced about a common-mode voltage $V_{cm}$. The controller 90 is further configured to provide a backgate voltage $V_{bg}$ to the output backgate to thereby establish a substantially-constant output current $I_{ref}$ through the output diode-coupled transistor 86.

In order to examine the output impedance of the network 80, attention is initially directed to the impedance of diode-coupled transistors. An expression for this impedance can be obtained from the knowledge that the drain current of a metal-oxide-semiconductor field-effect transistor in saturation is known to approximate $$I_D = \frac{k}{2}(V_{GS} - V_T)^2 \tag{1}$$

wherein $V_T$ is the transistor's threshold voltage and the constant k is a function of electron mobility, gate oxide capacitance and the ratio of width and length of the transistor's gate. The transistor's transconductance $g_m$ is thus $$g_m = \frac{\partial I_D}{\partial V_{GS}} = k(V_{GS} - V_T) \tag{2}$$

and, since the impedance of a diode-coupled transistor is known to approximate the inverse of the transistor's transconductance, the impedance $Z_{d-c}$ of the diode-coupled transistor 86 is approximately given by $$Z_{d-c} = \frac{1}{g_m} = \frac{1}{k(V_{GS} - V_T)} = \frac{V_{GS} - V_T}{2I_D}. \quad (3)$$

In FIG. 2A, the controller 90 maintains the output voltage $V_{ref}$ about the diode-coupled transistor 86 and maintains the output current of $I_{ref}$ through this diode-coupled transistor so that equation (3) becomes $$Z_{d-c} = \frac{V_{ref} - V_T}{2I_{ref}}. \quad (4)$$

As evidenced by this latter equation, the impedance $Z_{d-c}$ can be significantly lower than other typical output elements. If the diode-coupled transistor 86 of FIG. 2A were replaced by a resistor, for example, the resulting impedance $Z_r$ would be given by $$Z_r = \frac{V_{ref}}{I_{ref}}. \quad (5)$$

From equations (4) and (5), it is apparent that the impedance $Z_{d-c}$ will be substantially less than $Z_r$ (e.g., by an order of magnitude) as the magnitude of the controlled output voltage $V_{ref}$ approaches the threshold voltage $V_T$.

In FIG. 2A, the controller 90 varies the backgate voltage $V_{bg}$ between the output backgate and the source of the diode-coupled transistor 86 to maintain a substantially-constant output current $I_{ref}$ through this transistor. To understand this control, it is first noted from FIG. 3 that terms $I_D$ and $V_{GS}$ can be respectively replaced with $I_{ref}$ and $V_{ref}$ so that equation (1) becomes $$I_{ref} = \frac{k}{2}(V_{ref} - V_T)^2. \quad (6)$$

It is further noted that the threshold voltage $V_T$ of the diode-coupled transistor 86 generally varies with the backgate voltage $V_{bg}$ in accordance with $$V_T = V_{T_o} + \gamma\left(\sqrt{|2\Phi - V_{bg}|} - \sqrt{|2\Phi|}\right) \quad (7)$$

wherein $V_{T_o}$ is the zero-bias threshold voltage, $\gamma$ is a body effect coefficient, and the term $\Phi$ is determined by transistor parameters such as electron charge and substrate doping concentration. Equations (6) and (7) show that the controller 90 can control the output current $I_{ref}$ by varying the backgate voltage $V_{bg}$ of the diode-coupled transistor 86.

An advantageous feature of a complementary common-drain output stage is that it drives a load with the inherently-low impedances of source followers. In the reference network 80 of FIG. 2A, the diode-coupled transistor 86 is inserted between these low impedance structures. Because equation (4) shows that this diode-coupled transistor also has a low impedance, it is apparent that the network 80 of FIG. 2A provides a desirably-low output impedance at the top and bottom output ports 87 and 88 which enhances the speed and accuracy of reference voltages provided to systems such as the converter system 20 of FIG. 1.

The diode-coupled transistor 86 is arranged to receive a backgate signal $V_{bg}$ from a controller 90 to thereby establish a substantially-constant output current $I_{ref}$ through the output current valve 86. In another significant feature of the network 80, the span $V_{ref}$ between the reference voltages $V_{reft}$ and $V_{refb}$ can be selectively altered by the controller 90 while the output current $I_{ref}$ remains substantially constant. In particular, the top and bottom reference voltages $V_{reft}$ and $V_{refb}$ vary with the gate signals provided to the top and bottom output transistors 83 and 84 while the output current is a function of the backgate voltage $V_{bg}$. Thus, the output current $I_{ref}$ can be set to a selected value which then remains unchanged as $V_{ref}$ is moved over a predetermined range. This constant output current $I_{ref}$ substantially enhances the overall efficiency of a converter system that includes the reference network 80.

In order to stabilize the reference voltages $V_{reft}$ and $V_{refb}$, the reference voltage $V_{ref}$ is preferably provided to the controller 80 by a source such as the source 100 of FIG. 2B which includes a bandgap reference 101 and a single-to-double ended voltage converter 102. The bandgap reference provides a bandgap voltage (e.g., on the order of 1.25 volts) that is substantially independent of temperature, process and supply variations.

The converter 102 converts this bandgap voltage to double-ended voltages that are spaced by a reference voltage $V_{ref}$ which can be selected by a selection signal $S_{ref}$. A desired common-mode level can be established by providing a common-mode voltage $V_{cm}$ to the controller 100 from a suitable source (e.g., a fixed voltage source or a buffered voltage divider operating from a supply rail). In addition, therefore, to a substantially-constant output current $I_{ref}$, the reference network 80 provides reference voltages $V_{reft}$ and $V_{refb}$ that are selectable and substantially independent of temperature, process and supply variations.

Figure 3:
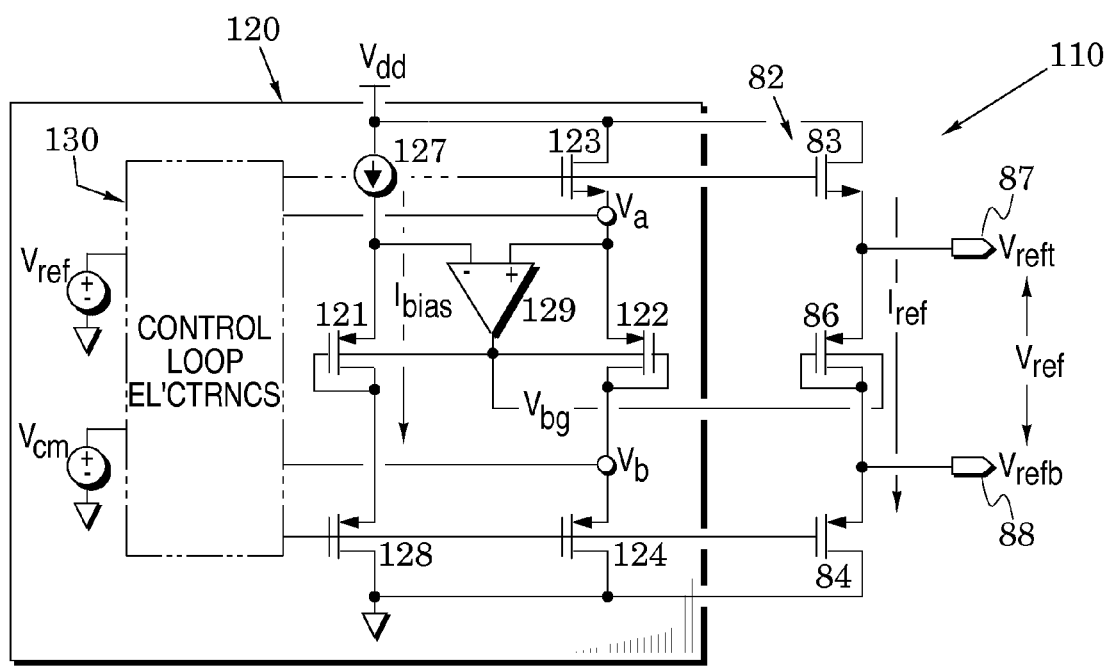
FIGS. 3 and 4 illustrate controller embodiments in the network of FIG. 2A.

FIG. 3 illustrates a network embodiment 110 that includes the complimentary common-drain output stage 82 and the diode-coupled transistor 86 of FIG. 2A wherein the controller 100 of FIG. 2A is realized as a controller embodiment 120. The controller 120 includes first and second replica diode-coupled transistors 121 and 122 whose backgates are coupled together and also coupled to the backgate of the output diode-coupled transistor 86.

The second replica diode-coupled transistor 122 is coupled between first and second bias transistors 123 and 124 that are respectively gate-coupled to the top and bottom output transistors 83 and 84. The first replica diode-coupled transistor 122 receives a bias current $I_{bias}$ from a current source 127 and passes this current to a third bias transistor 128 which is gate-coupled the bottom output transistor 84. A differential amplifier 129 is arranged to provide a backgate voltage $V_{bg}$ to the coupled backgates of the first and second replica diode-coupled transistors 121 and 122 to thereby reduce the voltage between sources of these transistors. The same backgate voltage $V_{bg}$ is also coupled to the backgate of the output diode-coupled transistor 86.

The controller 120 also includes a control loop electronics 130 that drives the gates of the second and third bias transistors 123 and 124 in response to a reference voltage $V_{ref}$ and a common-mode voltage $V_{cm}$ and to feedback from opposite terminals of the second diode-coupled transistor 122. Action of the control loop electronics causes first and second bias voltages $V_a$ and $V_b$ across the second diode-coupled transistor 122 to be spaced apart by the reference voltage $V_{ref}$ and to be equally spaced from the common-mode voltage $V_{cm}$. The reference voltage $V_{ref}$ and a common-mode voltage $V_{cm}$ are preferably independent of temperature, process and supply variations and can be provided by a suitable source such as the source 100 of FIG. 2B.

With the first and second bias voltages $V_a$ and $V_b$ established, the differential amplifier 129 adjusts the backgate voltage $V_{bg}$ so that the source of the first diode-coupled transistor is also set to the first bias voltage $V_a$. An equality must then exist between the sum of the source-to-gate voltages of the first diode-coupled transistor 121 and third bias transistor 128 and the sum of the source-to-gate voltages of the second and third bias transistors 123 and 124.

If the first and second diode-coupled transistors 121 and 122 are equally sized and the second and third bias transistor 124 and 128 are equally sized, then this equality requires that the second diode-coupled transistor 122 carries the same bias current $I_{bias}$ that flows through the first diode-coupled transistor 121. Assuming initially that the first bias transistor 123 and the top output transistor 83 are equally sized and that the second bias transistor 124 and the bottom output transistor 84 are equally sized, the same bias current $I_{bias}$ must also flow through the output diode-coupled transistor 86.

In another network embodiment, the top and bottom output transistors 83 and 84 can be increased in size so that, while they respectively still have the same current density as the first and second bias transistors 123 and 124, they now provide a reference current $I_{ref}$ through the output diode-coupled transistor 86 which has a magnitude greater than that of the bias current $I_{bias}$ from the current source 127. This latter network embodiment enhances network efficiency since it permits the currents flowing in the controller 120 to be significantly reduced. The reference current $I_{ref}$ through the output diode-coupled transistor 86 will now a selected multiple of the bias current $I_{bias}$ of the current source 127 while the reference voltage $V_{ref}$ across the output diode-coupled transistor 86 will be controlled by the voltages provided to the control loop electronics 130.

Figure 4:
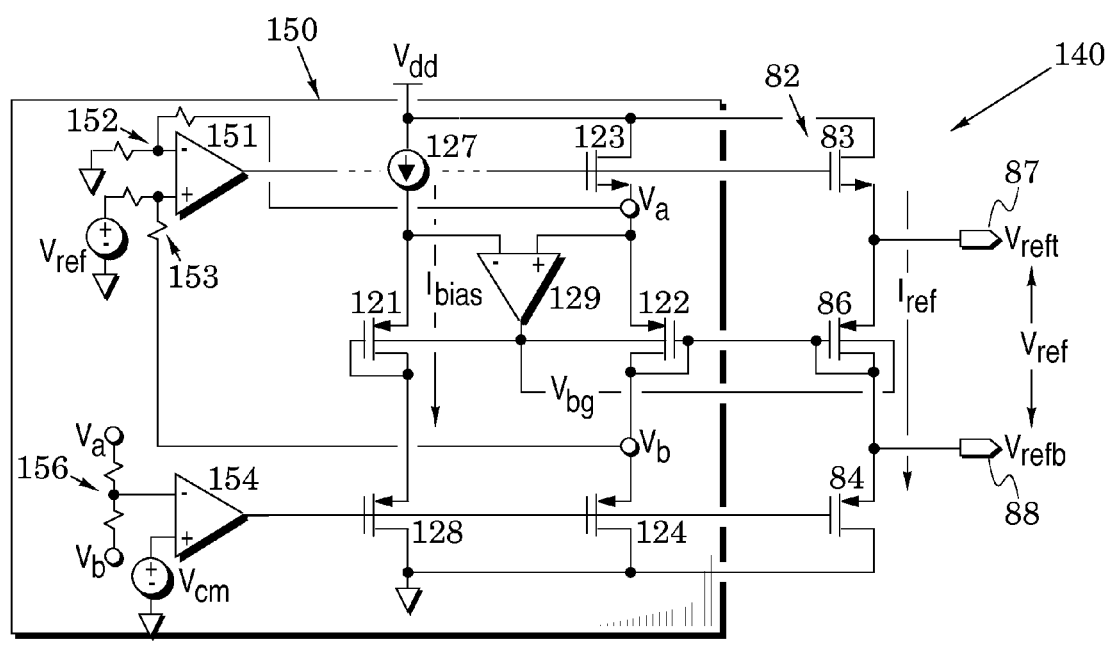

FIG. 4 illustrates another network embodiment 140 that includes elements of the network 110 of FIG. 3 with like elements indicated by like reference numbers. The network 140 has a controller 150 which is the same as the controller 120 of FIG. 3 except it shows an embodiment of the control loop electronics 130 of FIG. 3.

In this control loop embodiment, a differential amplifier 151 drives the gate of the first bias transistor 123 to reduce the difference between voltages at this amplifier's input ports that are provided by voltage dividers 152 and 153. The voltage dividers 152 and 153 are respectively coupled to the first and second bias voltages $V_a$ and $V_b$ wherein the voltage divider 153 is offset by the voltage $V_{ref}$ of a voltage source. In addition, a differential amplifier 154 drives the gates of the second and third bias transistors 124 and 134 to reduce the difference between voltages at this amplifier's input ports that are provided by the voltage $V_{cm}$ of a voltage source and by a voltage divider 156 that is coupled between the first and second bias voltages $V_a$ and $V_b$.

The first and second bias voltages $V_a$ and $V_b$ are thus controlled to differ by the reference voltage $V_{ref}$ and be centered about the common-mode voltage $V_{cm}$. Because the first bias transistor 123 and the top output transistor 83 have common current densities and the second and third bias transistors 124 and 134 have common current densities, voltages at the output ports 91 and 92 are also controlled to differ by the reference voltage $V_{ref}$ and be centered about the common-mode voltage $V_{cm}$. The voltages $V_{ref}$ and $V_{cm}$ are preferably provided by a source such as the source 100 of FIG. 2B so that they are substantially independent of temperature, process and supply variations.

In the network embodiment 80 of FIG. 2A, the output diode-coupled transistor 86 is exemplarily shown as a pmos transistor. In order to maintain the output reference current $I_{ref}$, the controller 90 adjusts the backgate voltage $V_{bg}$ at the backgate of this transistor. If the output reference voltage $V_{ref}$ is initially raised and then lowered, the backgate voltage $V_{bg}$ must initially rise and then lower to maintain a constant reference current $I_{ref}$.

Figure 5:
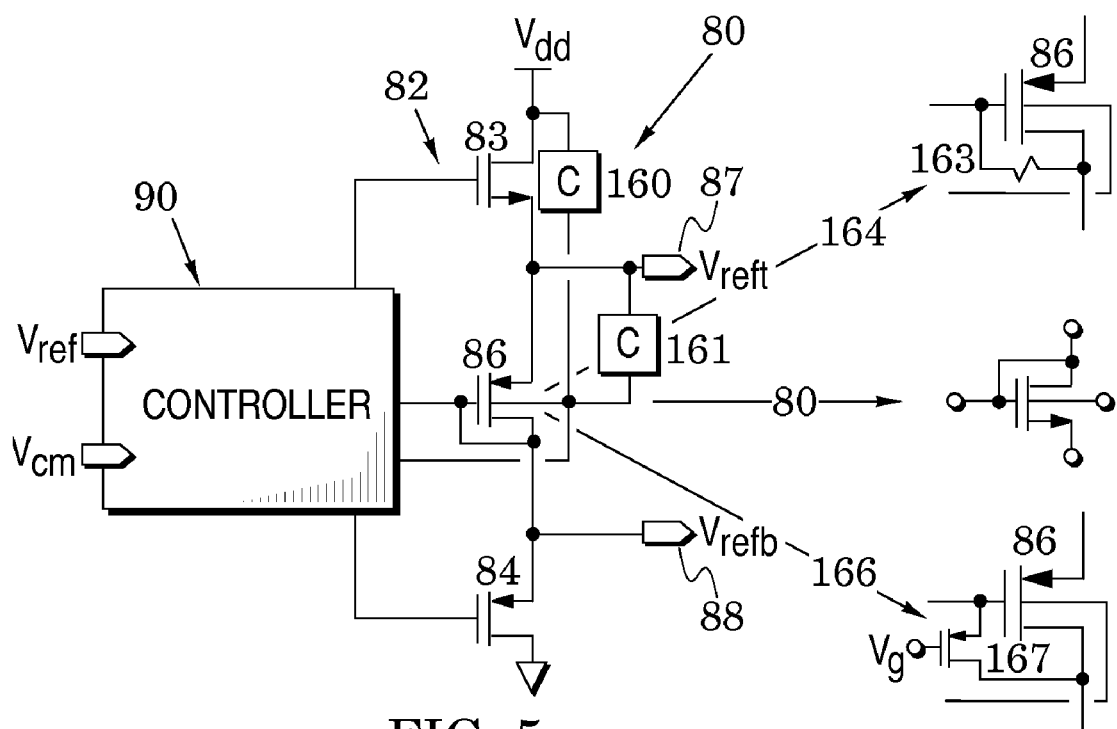
FIG. 5 illustrates further differential embodiments of the network of FIG. 2A.

The backgate voltage $V_{bg}$, however, cannot rise above the supply voltage $V_{dd}$. Although a boosted supply voltage can be provided to accommodate a further rise, care must be taken to not exceed the breakdown limit of the output diode-coupled transistor 86. In the other direction, the backgate voltage $V_{bg}$ should not be allowed to drop below the top reference voltage $V_{reft}$ because that would forward bias the junctions between the backgate and the source and drain. Preferably voltage clamps are installed to prevent these conditions. FIG. 5, for example, shows the network 80 of FIG. 2A with voltage clamps 160 and 161 respectively installed between the output backgate of the output diode-coupled transistor 86 and the supply voltage and the top output port 91.

A small-signal model of the output diode-coupled transistor 86 would include the gate-to-source capacitance $C_{gs}$ in parallel with the transistor's impedance between its source and its coupled gate and drain which is essentially $1/g_m$. Accordingly, the transistor's transfer function will have a pole dictated by the ratio $C_{gs}/g_m$. In accordance with another network embodiment, a resistor 163 can be inserted between the gate and drain of the diode-coupled transistor 86 as indicated by example arrow 164 in FIG. 5. The resistor introduces a transfer function zero which at least partially cancels the $C_{gs}/g_m$ pole and thereby substantially enhances the bandwidth and speed of the diode-coupled transistor 86.

Example arrow 166 in FIG. 5 indicates that the resistance of the resistor 163 can be realized instead with a transistor 167 that is coupled between the gate and drain of the diode-coupled transistor 86. The resistance (and thus the location of the desired transfer function zero) can be selected with a gate voltage $V_g$ applied to its gate.

Figure 2C:
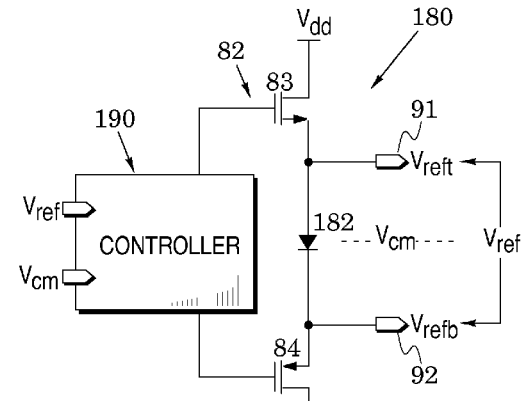
FIG. 2C illustrates another differential reference network embodiment usable, for example, in the system of FIG. 1.

FIG. 2C illustrates another reference network 180 which is similar to the network 80 of FIG. 2A with like elements indicated by like reference numbers. In contrast to the network 80, however, the diode-coupled transistor 86 is replaced with the bipolar junction of a diode 182. Although shown as a 2-terminal diode, the junction can also be provided by a diode-coupled bipolar junction transistor.

A controller 190 continues to control the output reference voltage $V_{ref}$ across the output ports 87 and 88 (e.g., with control loop electronics similar to that shown in FIG. 4) but the output reference current $I_{ref}$ is now set by the diode equation $$I_d = I_s \left( e^{V_{ref}/V_{TH}} - 1 \right) \tag{8}$$

in which $I_s$ is a constant, $V_{ref}$ is the voltage across the bipolar junction, and $V_{TH}$ is the thermal voltage which is approximately 26 millivolts at room temperature. Because the thermal voltage $V_{TH}$ varies linearly with temperature, the reference current $I_{ref}$ will vary with both temperature and the output reference voltage $V_{ref}$. However, the impedance $Z_d$ of the diode 182 is $$Z_d = \frac{V_{TH}}{I_d} \approx \frac{26\Omega}{I_d} \quad (9)$$

in which $I_d$ is the diode current in milliamps. Therefore, the output impedance can be exceptionally low so that the reference network 180 is particularly suited for use in systems where response speed is of paramount importance.

Reference networks have been described above wherein a constant reference current $I_{ref}$ is maintained through a diode-coupled transistor as an output reference voltage $V_{ref}$ about the transistor is selectively altered. Although these embodiments have been illustrated with a pmos transistor as the diode-coupled transistor, other network embodiments may be formed with nmos transistors as well as other transistor structures such as low-threshold transistors. With an nmos transistor, the differential amplifier 129 of FIG. 4 could be rearranged to control the bottom reference voltage $V_{refb}$ with the polarity of its input terminals reversed.

Figure 6A:
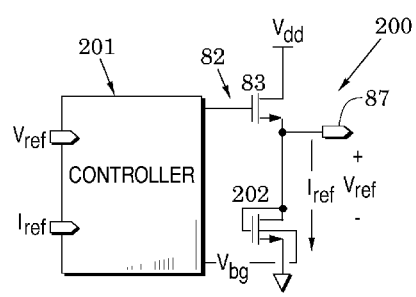
FIG. 6A is a reference network embodiment that is a single-ended version of the reference network embodiment of FIG. 2A.

FIG. 6A is directed to a reference network embodiment 200 that is similar to the reference network embodiment 80 of FIG. 2A with like elements indicated by like reference numbers. In the embodiment 200, however, the controller 90 is replaced by a controller 201 and the bottom output transistor 84 of FIG. 2A has been removed. In addition, the diode-coupled transistor 86 has been replaced by a diode-coupled transistor 202 of the opposite polarity that has its source coupled to ground. Accordingly, the reference voltage $V_{ref}$ is developed between the source of the output transistor 83 and ground. It was shown above, e.g., in paragraph 0030, that the controller can control the output current $I_{ref}$ by varying the backgate voltage $V_{bg}$ of a diode-coupled transistor such as the transistor 202.

Figure 6B:
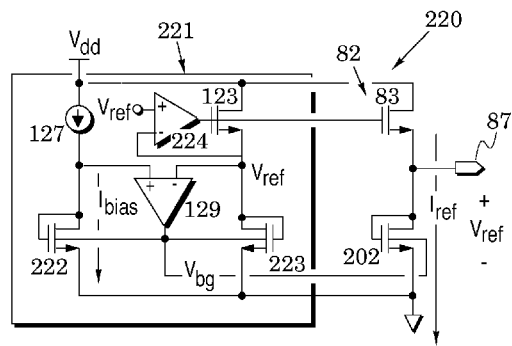
FIG. 6B is a detailed embodiment of the reference network of FIG. 6A.

FIG. 6B is similar to FIG. 6A but illustrates a reference network embodiment 220 that has an embodiment 221 of the controller of FIG. 6A. The controller 221 is similar to the controller 150 of FIG. 4 with like elements indicated by like reference numbers. In contrast to the network 150, however, the differential amplifier 154 and the second and third bias transistors 124 and 128 have been removed. Also, the first and second replica diode-coupled transistors 121 and 122 have been replaced by diode-coupled transistors 222 and 223 of the opposite polarity with their sources coupled to ground.

In addition, the differential amplifier 151 has been replaced by a differential amplifier 224 arranged to drive the gate of the first bias transistor 123 in response to the difference between the voltage of the source of the bias transistor 123 and the reference voltage $V_{ref}$. In operation, this difference is substantially zero so that the voltage at the source of the bias transistor 123 is controlled to be substantially the reference voltage $V_{ref}$. If the output transistor 83 and the diode-coupled transistor 202 are scaled versions of the bias transistors 123 and 223, then the port 87 will be controlled to be substantially the reference voltage $V_{ref}$.

The back-gate voltage of the first and second replica diode-coupled transistors 222 and 223 is also the back-gate voltage of the diode-coupled transistor 202 so that the output current $I_{ref}$ is a function of the bias current through the first diode-coupled transistor 222. In particular, the reference current $I_{ref}$ through the diode-coupled transistor 202 will be a selected multiple of the bias current $I_{bias}$ that is controlled by the relative sizing of the first replica diode-coupled transistor 222 and the output diode-coupled transistor 202.

Figure 7A:
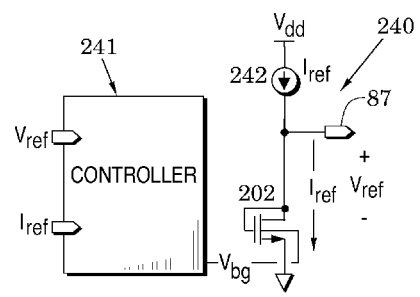
FIG. 7A is another single-ended reference network embodiment.

FIG. 7A is directed to a reference network embodiment 240 that is similar to the reference network embodiment 200 of FIG. 6A with like elements indicated by like reference numbers. In the embodiment 240, however, the controller 201 is replaced by a controller 241 and the output transistor 83 is replaced by a current source 242 that provides the output current $I_{ref}$.

Figure 7B:
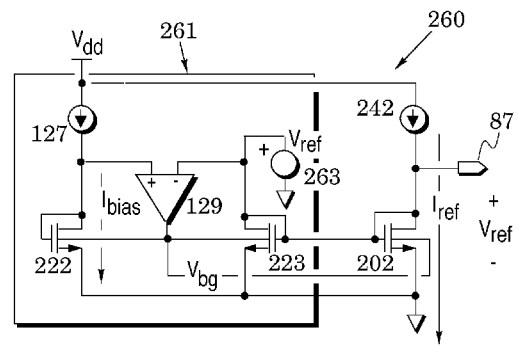
FIG. 7B is a detailed embodiment of the reference network of FIG. 7A.

FIG. 7B is similar to FIG. 7A but illustrates a reference network embodiment 260 that has an embodiment 261 of the controller of FIG. 7A. The controller 261 is similar to the controller 221 of FIG. 6B with like elements indicated by like reference numbers. In contrast to the controller 221, however, the differential amplifier 224 and the first bias transistor 123 have been replaced by a voltage source 263 that biases the drain of the diode-coupled transistor 223 to be at the reference voltage $V_{ref}$.

The reference network embodiments of FIGS. 6A-7B provide single-ended reference signals that are referenced to ground. These embodiments are fast and power efficient and they generate low-impedance reference signals through the use of an output diode-coupled transistor whose back-gate voltage $V_{bg}$ is provided by a controller. Because diode-coupled transistors exhibit a low impedance, they enhance the speed of the reference source.

Although exemplary networks have been illustrated with single diode-coupled transistors, other embodiments may be structured with multiple transistors (e.g., arranged in series). In other network embodiments, the multiple transistors can be embedded in a switch structure that permits any selected one of the transistors to be in use at a given time.

The inventive embodiments described herein are exemplary and numerous modifications, variations and rearrangements may achieve substantially equivalent results and are intended to be embraced in the appended claims.

We claim:

1. A reference network to provide a reference voltage, comprising:
    an output transistor;
    an output diode-coupled transistor having an output backgate and coupled to said output transistor; and
    a controller that is configured to control said output transistor to establish a reference voltage across said output diode-coupled transistor and to provide a backgate voltage to said output backgate to establish a substantially-constant output current through said output diode-coupled transistor;
    wherein said controller is configured to have:
    a bias transistor gate-coupled to said output transistor; and
    a differential amplifier arranged to drive a gate of said bias transistor and having a first input coupled to a source of said bias transistor and a second input coupled to receive a reference voltage.

2. A reference network to provide a reference voltage, comprising:
    an output transistor;
    an output diode-coupled transistor having an output backgate and coupled to said output transistor; and
    a controller that is configured to control said output transistor to establish a reference voltage across said output diode-coupled transistor and to provide a backgate voltage to said output backgate to establish a substantially-constant output current through said output diode-coupled transistor;
    wherein said controller includes:
    first and second replica diode-coupled transistors respectively having first and second replica backgates coupled to said output backgate wherein one of said first and second replica diode-coupled transistors carries a bias current; and a differential amplifier arranged to drive said first and second replica backgates to reduce a voltage difference between terminals of said first and second replica diode-coupled transistors.

3. The network of claim 2, wherein:

said controller includes a current source to provide said bias current and includes a bias transistor gate-coupled to said output transistor;

one of said first and second replica diode-coupled transistors is coupled to said bias transistor; and the other of said first and second replica diode-coupled transistors is coupled to receive said bias current.

4. The network of claim 2, wherein said output diode-coupled transistor is sized to have a first gate width-to-length ratio and said first and second replica diode-coupled transistors are sized to have second gate width-to-length ratios less than said first gate width-to-length ratio.

5. The network of claim 2, wherein said output diode-coupled transistor is an nmos transistor.

6. A reference network to provide a reference voltage, comprising:

a current source;

an output diode-coupled transistor having an output backgate and coupled to said current source; and a controller that is configured to establish a reference voltage across said output diode-coupled transistor and to provide a backgate voltage to said output backgate to establish a substantially-constant output current through said output diode-coupled transistor;

wherein said controller includes first and second replica diode-coupled transistors respectively having first and second replica backgates coupled to said output backgate wherein one of said first and second replica diode-coupled transistors carries a bias current and the other of said first and second replica diode-coupled transistors is coupled to receive a reference voltage.

7. The network of claim 6, further including:

a second current source to provide said bias current; and a voltage source to provide said reference voltage.

8. The network of claim 6, wherein said output diode-coupled transistor is sized to have a first gate width-to-length ratio and said first and second replica diode-coupled transistors are sized to have second gate width-to-length ratios less than said first gate width-to-length ratio.

9. The network of claim 6, wherein said output diode-coupled transistor is an nmos transistor.

10. A signal converter system that provides a digital code which corresponds to an analog input signal, comprising:

a pipelined arrangement of converter stages configured to provide said digital code in response to said analog input signal wherein at least one of said stages includes a multiplying digital-to-analog converter that responds to top and bottom reference voltages; and a reference network that includes:

an output transistor;

an output diode-coupled transistor and coupled to said output transistor and having an output backgate; and a controller that is configured to control said output transistor to establish a reference voltage across said output diode-coupled transistor and to provide a backgate voltage to said output backgate to establish a substantially-constant output current through said output diode-coupled transistor.

11. The network of claim 10, wherein said controller is configured to have:

a bias transistor gate-coupled to said output transistor; and a differential amplifier arranged to drive a gate of said bias transistor and having a first input coupled to a source of said bias transistor and a second input coupled to receive a reference voltage.

12. The network of claim 10, wherein said controller includes:

first and second replica diode-coupled transistors respectively having first and second replica backgates coupled to said output backgate wherein one of said first and second replica diode-coupled transistors carries a bias current; and a differential amplifier arranged to drive said first and second replica backgates to reduce a voltage difference between terminals of said first and second replica diode-coupled transistors.

13. The network of claim 12, wherein:

said controller includes a current source to provide said bias current and includes a bias transistor gate-coupled to said output transistor;

one of said first and second replica diode-coupled transistors is coupled to said bias transistor; and the other of said first and second replica diode-coupled transistors is coupled to receive said bias current.

* * * * *